(12) United States Patent
Zhan et al.

(10) Patent No.: US 7,423,489 B2
(45) Date of Patent: Sep. 9, 2008

(54) LOW RETURN LOSS RESISTIVE FEEDBACK AMPLIFIER

(75) Inventors: Jing-Hong C. Zhan, Hillsboro, OR (US); Stewart S. Taylor, Beaverton, OR (US)

(73) Assignee: Intel Corporation, Santa Clara, CA (US)

( * ) Notice: Subject to any disclaimer, the term of this patent is extended or adjusted under 35 U.S.C. 154(b) by 134 days.

(21) Appl. No.: 11/435,397

(22) Filed: May 16, 2006

(65) Prior Publication Data

US 2007/0268072 A1 Nov. 22, 2007

(51) Int. Cl.
*H03F 1/34* (2006.01)

(52) U.S. Cl. .................... 330/294; 330/85; 330/109
(58) Field of Classification Search ............... 330/294, 330/85, 109
See application file for complete search history.

(56) References Cited

U.S. PATENT DOCUMENTS

| 5,241,283 | A | * | 8/1993 | Sutterlin | 330/51 |
| 5,592,124 | A | * | 1/1997 | Mullins et al. | 330/308 |
| 7,009,373 | B1 | * | 3/2006 | Garavan | 323/313 |
| 7,196,577 | B2 | * | 3/2007 | Brunner | 330/86 |

* cited by examiner

*Primary Examiner*—Patricia Nguyen
(74) *Attorney, Agent, or Firm*—Lee & Hayes PLLC

(57) ABSTRACT

Embodiments related to resistive feedback amplifiers are presented herein.

20 Claims, 4 Drawing Sheets

LOW RETURN LOSS RESISTIVE FEEDBACK AMPLIFIER

BACKGROUND

Resistive feedback amplifiers are often used in the implementation amplifiers, such as Low Noise Amplifiers (LNAs). Several concerns associated with the design of amplifiers utilized for low noise radio frequency (RF) amplification include: (1) providing a sufficiently low Noise Figure (NF); (2) achieving high gain; and (3) the realization of minimum power consumption.

FIG. 1 illustrates a conventional resistive feedback amplifier 100 that may be used in many wireless devices. Such wireless devices may require the amplifier 100 to achieve a low NF, provide reasonable gain with sufficient linearity, a predetermined input impedance and low power consumption. Unfortunately, the amplifier 100 has difficulty realizing these requirements due to the fairly broad bandwidth requirements of many current wireless devices. To demonstrate, consider the following.

In general, the resistive feedback amplifier 100 illustrated in FIG. 1 has an input resistance that is given by $$R_{input} = \frac{R_F + R_L}{1 + g_m R_L}$$

where $g_m$ is the transconductance gain of the NPN transistor, $R_F$ is the feedback resistor and $R_L$ is the load resistor. The gain of the amplifier 100 is given by $$A_v = \frac{-\left(g_m - \frac{1}{R_F}\right)}{\left(\frac{1}{R_F} + \frac{1}{R_L}\right)}$$

A higher transconductance gain may create a larger loop gain, which leads to better linearity. Moreover, a higher transconductance gain will generally increase current consumption of the amplifier 100. However, for higher frequency operation, which is generally needed for broad bandwidth technologies, this increased current consumption is normally required to obtain enough gain.

With the resistive feedback amplifier 100 illustrated in FIG. 1 it is generally difficult to obtain both high gain and large bandwidth. This is because there is a tradeoff between the gain and the bandwidth. In addition, due to the limited bandwidth of the amplifier 100, the input impedance tends to behave inductively rather than resistively. This may cause the gain to plateau or even decrease at high frequencies. In some cases, the input impedance may be capacitive, because the input impedance of the input transistor is capacitive.

BRIEF DESCRIPTION OF THE DRAWINGS

The detailed description is described with reference to the accompanying figures. In the figures, the left-most digit(s) of a reference number identifies the figure in which the reference number first appears. The use of the same reference numbers in different figures indicates similar or identical items.

DETAILED DESCRIPTION

Resistive feedback amplifiers can be found in many different electronic devices. For example, a resistive feedback amplifier may be used in association with a low noise amplifier (LNA). LNAs are used, for example, in mobile communication devices, such as wireless/cellular phones, portable digital assistants (PDAs), wireless chipsets for portable computers, and so forth.

This disclosure is directed to resistive feedback amplifiers. Such resistive feedback amplifiers can be used in a variety of radios requiring a low noise figure, high linearity, high gain, large bandwidth and/or low sensitivity. Such resistive feedback amplifiers can be used for various applications, including ultra wide band (UWB), OFDM(A), CDMA, TDMA, etc. based communication devices implemented in networking architectures including, but not limited to personal area networks (PAN), local area networks (LAN), wide or metropolitan area networks (W/MAN), cellular/wireless networks, and the like.

The resistive feedback amplifiers described herein may be fabricated using CMOS technologies. The amplifiers may also be fabricated with other known technologies, such as bi-polar transistors. Additionally, the described resistive feedback amplifiers do not require the use of inductors, thereby reducing production costs and potentially die area requirements.

The following disclosure is organized to describe initially an implementation of a resistive feedback amplifier. An example radio system employing one or more resistive feedback amplifier is then described, followed by a discussion of procedures which may be performed to provide amplification of an electrical signal.

Resistive Feedback Amplifier

Figure 1:
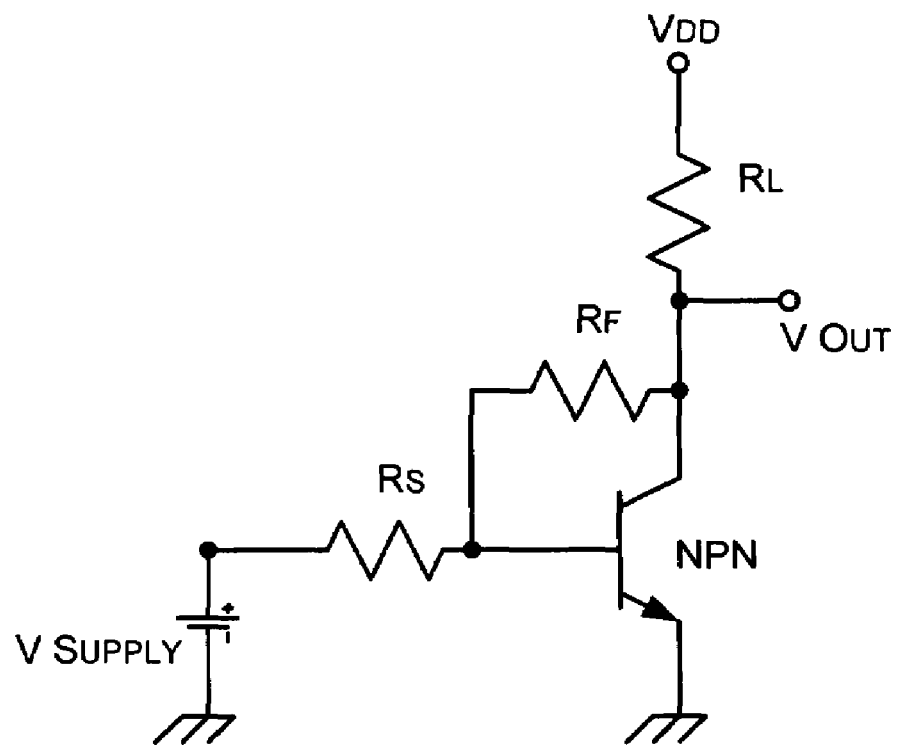
FIG. 1 is a circuit diagram illustrating a conventional resistive feedback amplifier circuit.
Figure 2:
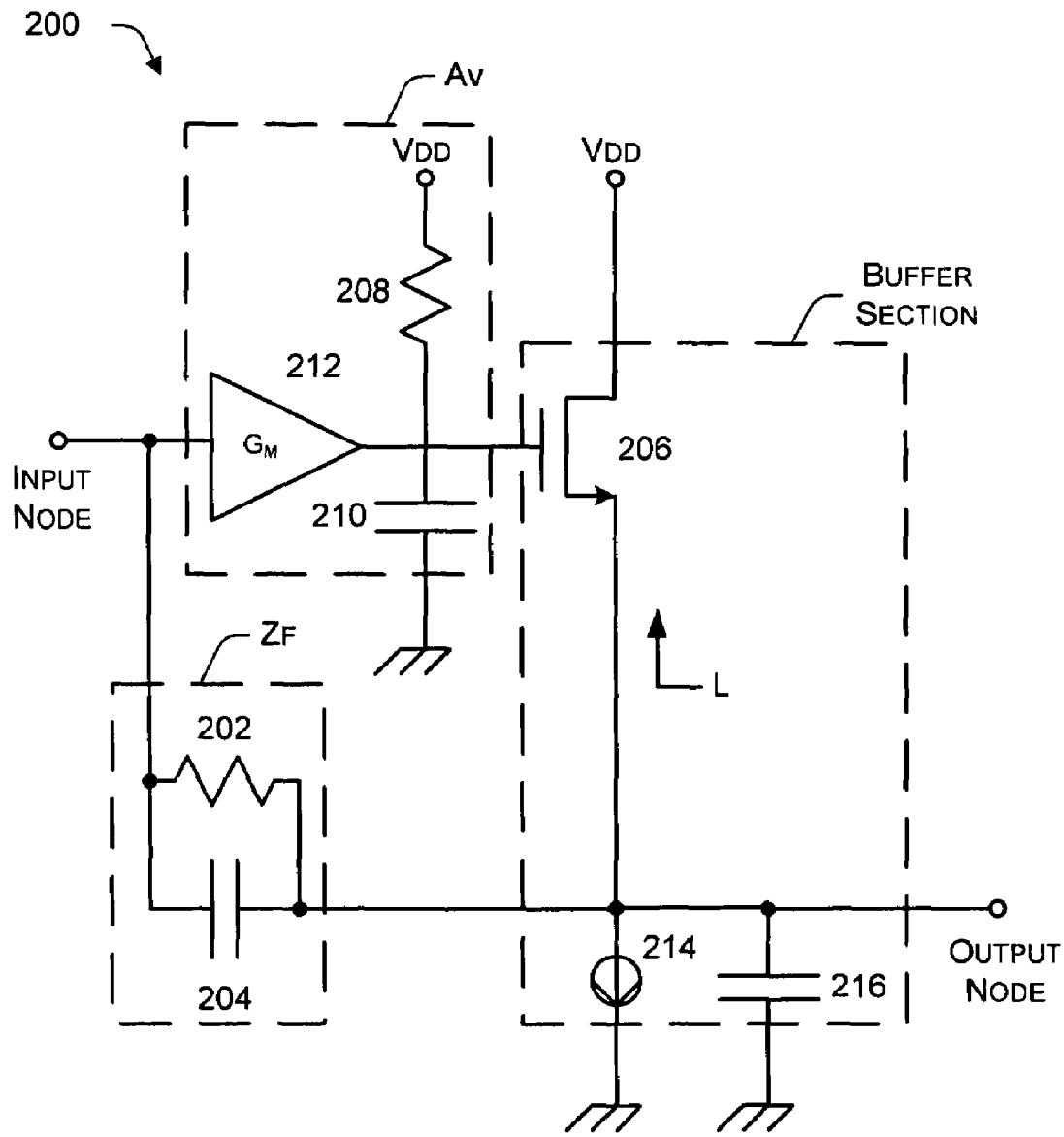
FIG. 2 is a circuit diagram illustrating one implementation of a resistive feedback amplifier.

FIG. 2 illustrates an implementation of a resistive feedback amplifier circuit 200. The resistive feedback amplifier circuit 200 may be implemented and fabricated as an integrated circuit using CMOS techniques, or other related implementation and fabrication techniques.

The amplifier circuit 200 includes a feedback impedance section $Z_f$ that may include a resistor 202 in parallel with a capacitor 204. The use of the capacitor 204 may improve the feedback impedance of the amplifier circuit 200 at high frequencies. Therefore, the feedback network of the amplifier circuit 200, which may be delineated by the feedback impedance section $Z_f$, may be frequency dependant. In general, the capacitor 204 of the feedback impedance section $Z_f$ in conjunction with the resistor 202 causes the feedback impedance to be complex, which may improve the input reflection coefficient, $S_{11}$.

The amplifier circuit 200 may also include a buffer section. The buffer section may include a transistor 206 having a gate, drain and source. In one implementation, the transistor 206 may be a source-follower transistor. In another implementation, the transistor 206 has a second-order response. This second-order response may be achieved by ensuring the impedance looking into the source of the transistor 206 may be inductive. The second-order response of the transistor 206 may improve the input reflection coefficient, $S_{11}$.

In one implementation of the feedback impedance section $Z_f$, the capacitor 204 is not used and only the transistor 206 and its second-order response are used to improve $S_{11}$. In another implementation, the capacitor 204 in conjunction with the resistor 202 are used to improve $S_{11}$, and the transistor 206 simply functions conventionally with relatively flat frequency response and constant gain. In other words, in conventional amplifiers, the transistor 206 would normally be a simple buffer having a first-order response. In yet another implementation, both the capacitor 204 and the transistor 206 and its second-order response are used to improve $S_{11}$.

Additional details of the resistive feedback amplifier 200 will now be discussed. An amplifier gain section $A_v$ may include a load resistor 208. A capacitor 210 is illustrated to show parasitic loading. A terminal of the resistor 208 may be connected to a voltage source $V_{dd}$. The voltage source $V_{dd}$ may also be connected to a drain of the transistor 206.

The amplifier gain section $A_v$ may also include a transconductance gain $g_m$ section. This transconductance gain $g_m$ section may be realized using a cascode-amplifier, such as a common-source amplifier followed by a common-gate amplifier. The transconductance gain $g_m$ section may be connected to a gate of the transistor 206 and an input node. For this section of the resistive feedback amplifier 200, the gain may be expressed as $$A_v = g_m(R_{208} \| C_{210}).$$

Turning again to the buffer section, the impedance looking into the source of the transistor 206 may be expressed as $$L = R_{208}/2\pi f_t$$

where $f_t$ may be the transition frequency of the transistor 206. The buffer section may further include a biasing current source 214 and a parasitic capacitance 216. In one implementation, the parasitic capacitance 216 may be the combination of the parasitic capacitance 216 with an added physical capacitor. Varying the size of the transistor 206, the current source 214, an added capacitor 216 and/or the resistor 208 may change the value of L and the corresponding resonant frequency. As should be understood by those skilled in the art, the buffer section may have unity voltage gain, or alternatively, the buffer section may provide gain greater than unity.

In an alternative implementation of the resistive feedback circuit 200, a resistor may be placed between the gate of the transistor 206 and the load formed by the resistor 208 and the capacitance 210. Such a resistor may be advantageous or even necessary if the capacitance 210 is of a size that causes the resistor 208 to be bypassed. Bypassing the resistor 208 may negatively affect the output impedance of the transistor 206, and the use of the additional resistor may reduce or even eliminate this negative affect that a larger capacitance 210 may have on the output impedance of the transistor 206.

Example Radio System

Figure 3:
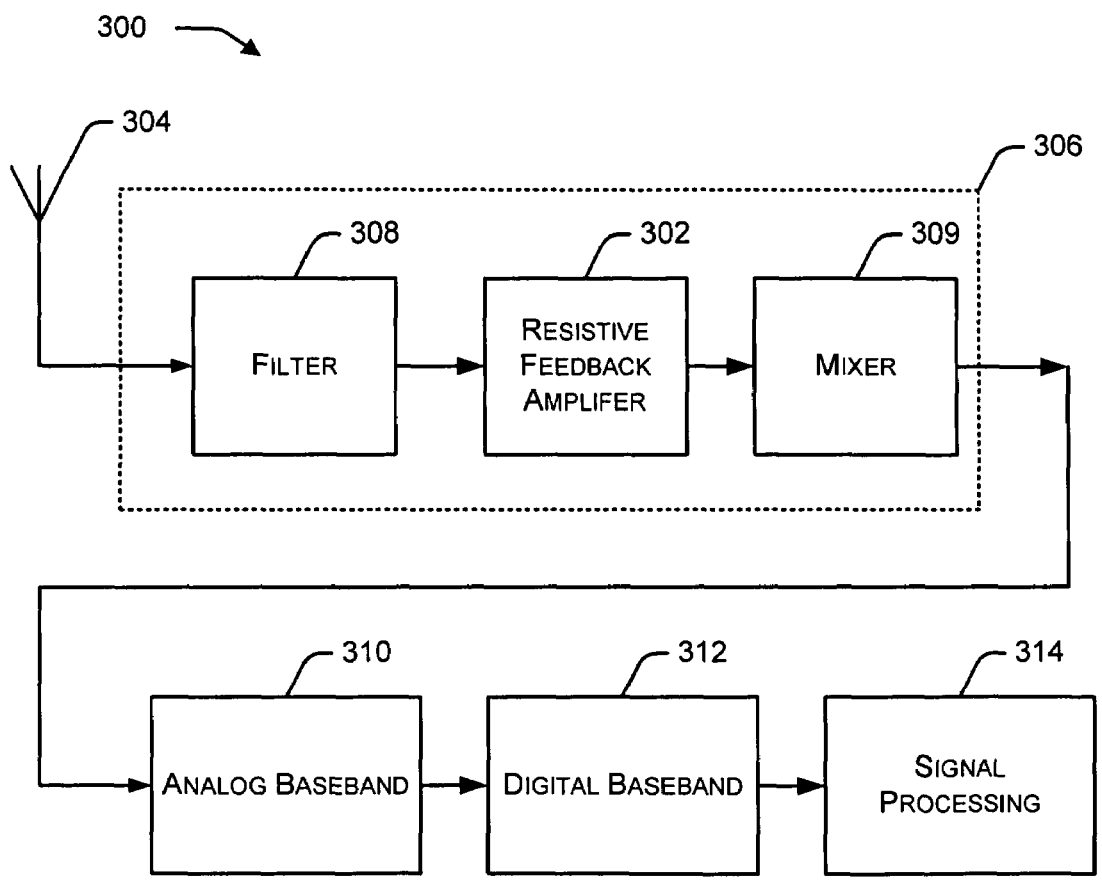
FIG. 3 is a block diagram showing an example radio system employing a resistive feedback amplifier, such as the resistive feedback amplifier illustrated in FIG. 1.

FIG. 3 illustrates an example radio system 300 that employs a resistive feedback amplifier 302, which may be implemented as the resistive feedback amplifier illustrated in FIG. 2. The resistive feedback amplifier 302 may be used in conjunction with an LNA employed by the radio system 300. The radio system 300 may be part of a wireless communication device, such as a wireless telephone, a wireless communication device/card for use with a computing device, or the like.

The radio system 300 includes an antenna 304 coupled to a radio front end component 306. The antenna 304 receives a RF input signal and transmits the RF input signal to the radio front end component 306. The radio front end component 306 includes the resistive feedback amplifier 302, employed by an LNA, where the LNA may be configured to amplify the RF input signal to a desired level.

The front end 306 may also include one or more filters 308. It is to be appreciated that many variations and configurations in radio front end processing exist and that the resistive feedback amplifier 302 can be utilized in any such variation and configuration. In the illustrated implementation, the resistive feedback amplifier 302 follows the filter 308, which may be connected to the antenna 304. In some cases, there may be an additional filter following the resistive feedback amplifier 302. The front end 306 may further include a mixer 309 to down convert the RF signal to an intermediate frequency or baseband. In FIG. 3, the mixer 309 down converts the RF signal to baseband.

The mixer 309 of front end 306 may be coupled to an analog baseband section 310. The analog baseband section 310 provides variable gain and filtering, and may optionally perform analog to digital (A/D) conversion. The output of the analog baseband section 310 may therefore be in a digital format for processing by the digital baseband section 312.

The digital baseband section 312 may be programmed and/or configured to process the intermediate or baseband signal from the analog baseband section 310. If A/D conversion was not performed in the analog baseband section 310, the digital baseband section 312 may include A/D conversion as well as additional filtering. It is to be appreciated that such filtering may be implemented in the analog baseband section 310 (prior to conversion) or in the digital baseband section 312 (post conversion). The digital baseband section 312 may also perform appropriate demodulation of the signal. The digital baseband section 312 provides the processed digital signal to a signal processor 314 for final processing (e.g., decoding, data extraction, and the like) and use by a user/entity utilizing the radio system 300.

Those skilled in the art will understand and appreciate other configurations of radio systems (or portions thereof) that may utilize a resistive feedback amplifier described herein to amplify a signal with sufficient gain across a broad bandwidth and with a low noise figure.

Operation

The following discussion describes amplification techniques that may be implemented utilizing the previously described devices and system, as well as in other systems and devices. Aspects of the procedures may also be implemented in hardware, firmware, or software, or a combination thereof. The procedures are shown as a set of blocks that specify operations performed by one or more devices and are not necessarily limited to the order shown for performing the operations by the respective blocks. In portions of the following discussion, reference will be made to the components of FIGS. 2-3.

Figure 4:
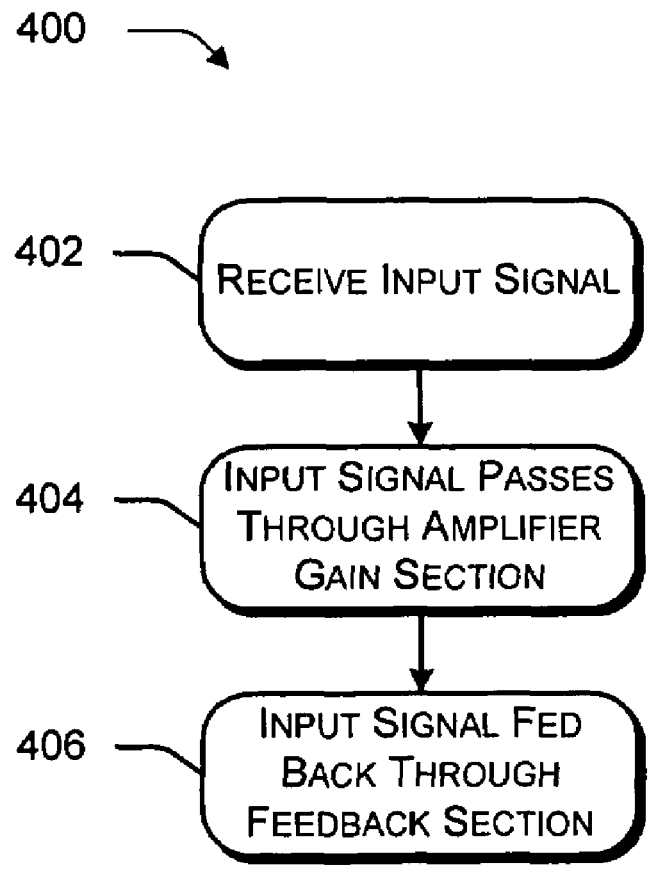
FIG. 4 is a flow diagram depicting an example procedure for amplifying a signal using a resistive feedback amplifier, such as the resistive feedback amplifier illustrated in FIG. 2.

FIG. 4 shows an example procedure 400 for producing signal gain using a resistive feedback amplifier, such as the resistive feedback amplifier 200. The resistive feedback amplifier may be part of a radio system, such as the radio system 300, or another system or device requiring the amplification of an electrical signal with sufficient gain over a broad bandwidth spectrum. Moreover, the resistive feedback amplifier may be employed by an LNA that may be used to achieve wideband performance.

At block 402, an input signal may be received. At block 404, the input signal may be passed through an amplifier gain and buffer sections. The buffer section may employ a transistor that has a second-order response. For example, the transistor 206 of the buffer section. The amplifier gain section and the transistor having the second-order response enable substantially good gain over a large frequency bandwidth.

At block 404, the input signal may be fed back through a feedback impedance section. This feedback impedance section may be the feedback impedance section $Z_f$ illustrated in FIG. 2. In one implementation, the feedback impedance section employs the use of a capacitor in parallel with a feedback resistor. The added capacitor may improve the input impedance of the resistive feedback amplifier at high frequencies and substantially good gain at such higher frequencies.

The acts of blocks 404 and 406 may be used together, or singularly to achieve substantially good gain at higher frequencies.

CONCLUSION

Although the subject matter has been described in language specific to structural features and/or methodological acts, it is to be understood that the subject matter defined in the appended claims is not necessarily limited to the specific features or acts described. Rather, the specific features and acts are disclosed as example forms of implementing the claims.

What is claimed is:

1. An apparatus, comprising:
a feedback amplifier circuit, the circuit including a buffer section including a transistor having a second-order response, wherein the buffer section includes a biasing current source in parallel with a capacitor; and
a feedback impedance section coupled to the buffer section.

2. The apparatus according to claim 1, wherein the transistor is a source-follower transistor.

3. The apparatus according to claim 1, wherein the feedback amplifier circuit further comprises a transconductance gain section coupled to a gate of the transistor.

4. The apparatus according to claim 3, wherein the transistor is a source-follower transistor.

5. The apparatus according to claim 1, wherein the feedback amplifier circuit further comprises a load resistor connected to the transistor.

6. The apparatus according to claim 1, wherein the feedback amplifier circuit further comprises a capacitor connected to a source of the transistor.

7. The apparatus according to claim 1, wherein the feedback impedance section includes a resistor.

8. The apparatus according to claim 1, wherein the feedback impedance section includes a resistor in parallel with a capacitor.

9. An apparatus, comprising:
a resistive feedback amplifier circuit including a buffer section having a transistor, wherein the buffer section includes a biasing current source in parallel with a capacitor; and
a feedback impedance section coupled to the buffer section, the feedback impedance section having a resistor in parallel with a capacitor.

10. The apparatus according to claim 9, wherein the buffer section includes a transistor having a second-order response.

11. The apparatus according to claim 10, wherein the transistor is a source-follower transistor.

12. The apparatus according to claim 9, further comprising an antenna capable of receiving a radio frequency (RF) signal, the antenna interfaced with the resistive feedback circuit.

13. An apparatus, comprising:
a resistive feedback amplifier circuit including
a buffer section including a transistor having a second-order response, wherein the buffer section includes a biasing current source in parallel with a capacitor; and
a feedback impedance section coupled to the amplifier gain section, the feedback impedance section having a resistor in parallel with a capacitor.

14. The apparatus according to claim 13, wherein the feedback amplifier circuit further comprises an amplifier gain section coupled to the transistor of the buffer section.

15. The apparatus according to claim 14, wherein the amplifier gain section includes a transconductance gain coupled to a gate of the transistor.

16. The apparatus according to claim 13, wherein a source of the transistor is coupled to a biasing current source and a capacitor.

17. The apparatus according to claim 13, wherein the transistor is a source-follower transistor.

18. The apparatus according to claim 13, further comprising an antenna capable of receiving a radio frequency (RF) signal, the antenna interfaced with the resistive feedback circuit.

19. A method, comprising:
receiving an radio frequency (RF) signal;
passing at least part of the radio frequency through a buffer section, the buffer section having a transistor having a second-order response, wherein the buffer section includes a biasing current source in parallel with a capacitor; and
feeding at least part of the radio frequency though a feedback impedance section, the feedback impedance section including at a resistor in parallel with a capacitor.

20. The method according to claim 19, further comprising passing the received RF signal through an amplifier gain section including a transconductance gain coupled to the transistor of the buffer section.

* * * * *